(12) United States Patent
Mathew et al.

(10) Patent No.: US 8,575,716 B2
(45) Date of Patent: Nov. 5, 2013

(54) INTEGRATED CIRCUIT DEVICES AND METHODS OF FORMING MEMORY ARRAY AND PERIPHERAL CIRCUITRY ISOLATION

(71) Applicant: Micron Technology, Inc., Boise, ID (US)

(72) Inventors: James Mathew, Boise, ID (US); Brett D. Lowe, Boise, ID (US); Yunjun Ho, Boise, ID (US); H. Jim Fulford, Meridian, ID (US); Jie Sun, Boise, ID (US); Zhaoli Sun, Lehi, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/893,454

(22) Filed: May 14, 2013

(65) Prior Publication Data

US 2013/0249050 A1 Sep. 26, 2013

Related U.S. Application Data

(62) Division of application No. 13/268,066, filed on Oct. 7, 2011, now Pat. No. 8,461,016.

(51) Int. Cl.
*H01L 21/70* (2006.01)

(52) U.S. Cl.
USPC .................. 257/510; 257/513; 257/E29.02

(58) Field of Classification Search
USPC .................... 257/510, 513, E29.02
See application file for complete search history.

(56) References Cited

U.S. PATENT DOCUMENTS

| | | | |
|---|---|---|---|
| 5,310,720 A | 5/1994 | Shin et al. | |
| 7,332,408 B2 | 2/2008 | Violette | |
| 7,402,499 B2 * | 7/2008 | Kitamura et al. | 438/429 |
| 7,498,273 B2 | 3/2009 | Mallick et al. | |
| 7,557,420 B2 | 7/2009 | Fucsko et al. | |
| 7,655,532 B1 | 2/2010 | Chen et al. | |
| 7,745,352 B2 | 6/2010 | Mallick et al. | |
| 7,838,390 B2 | 11/2010 | Kim et al. | |
| 7,858,490 B2 * | 12/2010 | Mitsuhira et al. | 438/427 |
| 7,968,425 B2 | 6/2011 | Bian et al. | |
| 8,012,847 B2 | 9/2011 | Patraw et al. | |

(Continued)

OTHER PUBLICATIONS

Stadele et al., "Reduction of layout variations with stress-compensated hybrid STI fills: a comprehensive analysis", IEEE, 2008.

(Continued)

*Primary Examiner* — Trung Q Dang
(74) *Attorney, Agent, or Firm* — Wells St. John, P.S.

(57) ABSTRACT

A method of forming memory array and peripheral circuitry isolation includes chemical vapor depositing a silicon dioxide-comprising liner over sidewalls of memory array circuitry isolation trenches and peripheral circuitry isolation trenches formed in semiconductor material. Dielectric material is flowed over the silicon dioxide-comprising liner to fill remaining volume of the array isolation trenches and to form a dielectric liner over the silicon dioxide-comprising liner in at least some of the peripheral isolation trenches. The dielectric material is furnace annealed at a temperature no greater than about 500° C. The annealed dielectric material is rapid thermal processed to a temperature no less than about 800° C. A silicon dioxide-comprising material is chemical vapor deposited over the rapid thermal processed dielectric material to fill remaining volume of said at least some peripheral isolation trenches. Other aspects are disclosed, including integrated circuitry resulting from the disclosed methods and integrated circuitry independent of method of manufacture.

27 Claims, 9 Drawing Sheets

(56) References Cited

U.S. PATENT DOCUMENTS

| | | |
|---|---|---|
| 8,242,574 B2 | 8/2012 | Lee |
| 8,269,306 B2 * | 9/2012 | Sandhu ............ 257/510 |
| 2005/0287731 A1 | 12/2005 | Bian et al. |
| 2006/0175718 A1 * | 8/2006 | Nitta ............ 257/797 |
| 2007/0212874 A1 | 9/2007 | Sandhu |
| 2007/0218645 A1 * | 9/2007 | Zhou ............ 438/427 |
| 2008/0169499 A1 | 7/2008 | Kiyotoshi |
| 2009/0035917 A1 | 2/2009 | Ahn et al. |
| 2009/0124061 A1 | 5/2009 | Kiyotoshi |
| 2010/0123211 A1 | 5/2010 | Kim |
| 2010/0230757 A1 | 9/2010 | Chen et al. |
| 2011/0049669 A1 | 3/2011 | Lee |
| 2011/0079871 A1 | 4/2011 | Kim |
| 2011/0151676 A1 | 6/2011 | Ingle et al. |

OTHER PUBLICATIONS

Heo et al., "Void Free and Low Stress Shallow Trench Isolation Technology using P-SOG for sub 0.1 um Device", IEEE, Sumposium on VLSI Technology Digest of Technical Papers, 2002.

* cited by examiner

INTEGRATED CIRCUIT DEVICES AND METHODS OF FORMING MEMORY ARRAY AND PERIPHERAL CIRCUITRY ISOLATION

RELATED PATENT DATA

This patent resulted from a divisional application of U.S. patent application Ser. No. 13/268,066, filed Oct. 7, 2011, entitled "Integrated Circuit Devices And Methods Of Forming Memory Array And Peripheral Circuitry Isolation", naming James Mathew, Brett D. Lowe, Yunjun Ho, H. Jim Fulford, Jie Sun, and Zhaoli Sun as inventors, the disclosure of which is incorporated by reference.

TECHNICAL FIELD

Embodiments disclosed herein pertain to integrated circuit devices and to methods of forming memory array and peripheral circuitry isolation.

BACKGROUND

Memory devices are typically provided as internal storage in computers. In general, memory devices contain an array of memory cells for storing data, and row and column decoder circuits that are peripheral and coupled to the array of memory cells for accessing the memory cells in response to an external address.

One type of memory is a non-volatile memory known as flash memory. This is a type EEPROM (Electrically-Erasable Programmable Read-Only Memory) that can be erased and reprogrammed in blocks. Many modern personal computers have their BIOS stored on a flash memory chip so that it can be easily updated. Such a BIOS is sometimes called a flash BIOS. Flash memory is also popular in wireless electronic devices because it enables the manufacturer to support new communication protocols as they become standardized and to provide the ability to remotely upgrade the devices for enhanced features.

A typical flash memory comprises a memory array that includes a large number of memory cells arranged in row and column fashion. Each of the memory cells includes a programmable field-effect transistor having a programmable charge trapping region capable of holding a charge. The cells are usually grouped into blocks. Each of the cells within a block can be electrically programmed on an individual basis by charging the charge trapping region of individual transistors. The charge can be removed from the charge trapping regions by a block erase operation. The data in a cell is determined by the presence or absence of the charge within the charge trapping region.

Memory devices are typically formed on semiconductor substrates. The array of memory cells and peripheral circuitry devices are disposed on the substrate. Adjacent devices or rows of devices are electrically isolated by trenches formed within the substrate which are subsequently filled with dielectric material, and is commonly referred to as trench isolation. The trench isolation provides voltage isolation by acting to prevent extraneous current flow through the substrate between certain memory cells within the array and between certain adjacent devices in the periphery. A continuing goal in integrated circuitry fabrication is to decrease the size of individual electronic components and place them ever closer together. Such has resulted in forming deeper and narrower isolation trenches, particularly in memory arrays versus within circuitry area peripheral to the memory arrays. Challenges exist in filling these trenches with dielectric material in forming suitably dense trench isolation.

One example trench isolation material is silicon dioxide. Such may be deposited by chemical vapor deposition, which may or may not be plasma enhanced, or from spin-on-dielectric material processing. Spin-on-dielectrics are conventionally densified in steam at temperatures greater than 500° C. This temperature can cause adverse properties to be introduced into tunnel dielectric material of the flash memory transistor, which degrades memory cell reliability. Line-bending has been seen to occur of the tunnel dielectric and charge trapping material while filling isolation trenches when chemical vapor depositing using TEOS with $O_3$.

DETAILED DESCRIPTION OF EXAMPLE EMBODIMENTS

Figure 1:
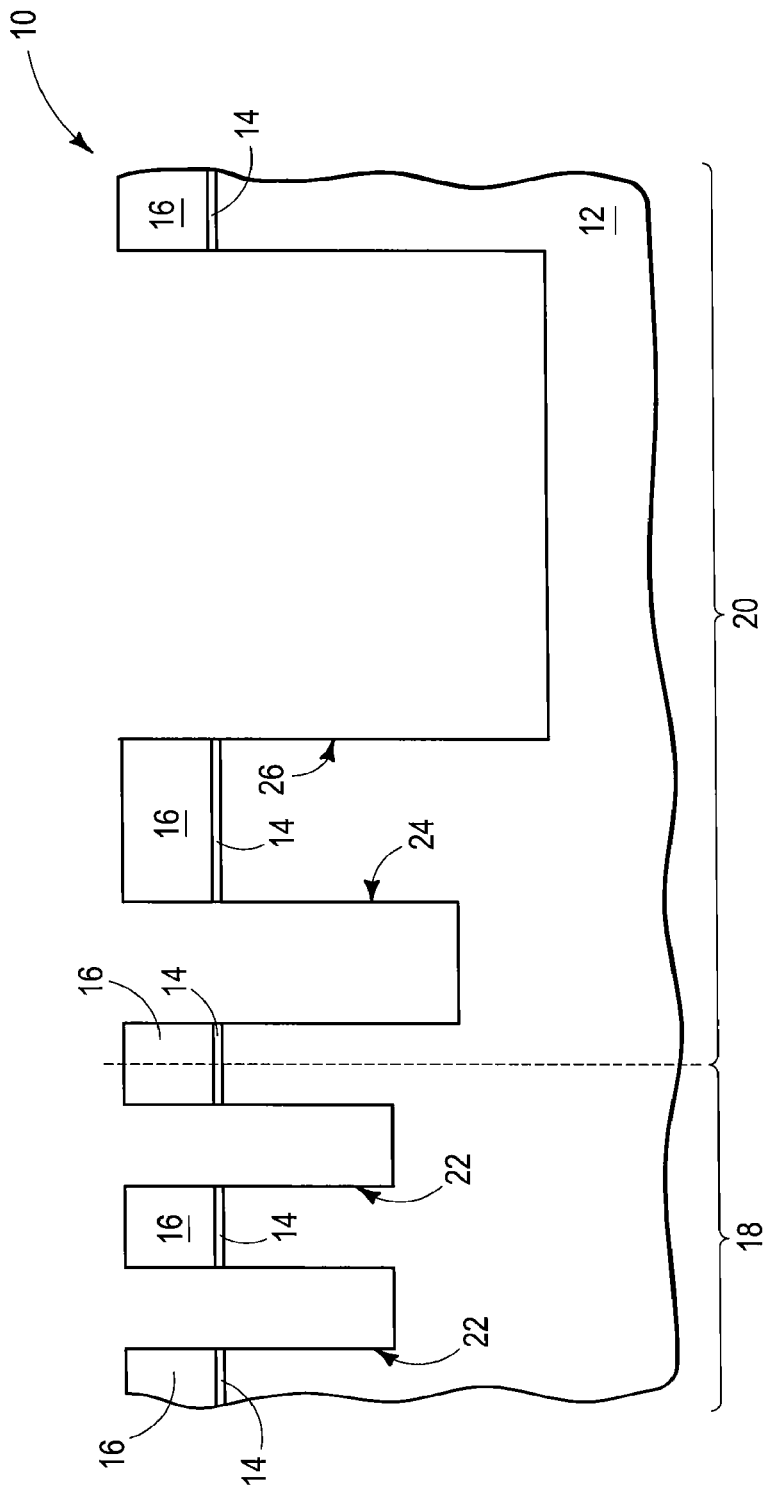
FIG. 1 is a diagrammatic sectional view of a substrate in process in accordance with an embodiment of the invention.

Example methods of forming memory array isolation and peripheral circuitry isolation in the fabrication of an integrated circuit device in accordance with some embodiments of the invention are initially described with reference to FIGS. 1-6. Referring to FIG. 1, a substrate 10 in one embodiment comprises semiconductor material 12 having a tunnel dielectric 14 and charge trapping material 16 formed thereover. An example semiconductor material 12 is monocrystalline silicon suitably background doped to function as active area. Regardless, semiconductor material 12 may be homogenous or non-homogenous, and if non-homogenous may include dielectric material and/or conductive material therein or a part thereof. An example tunnel dielectric 14 is silicon dioxide deposited to an example thickness range of from about 50 Angstroms to about 80 Angstroms. Example charge trapping materials include polysilicon, gallium indium zinc oxide, and metal oxides comprising suitable nanocrystals and/or quantum dots. An example thickness range for material 16 is from about 30 Angstroms to about 1,000 Angstroms. Substrate 10 comprises a memory array region 18 and a region 20 peripheral to memory array region 18 and referred to as a peripheral region 20. Logic circuitry may be fabricated within peripheral region 20. Control and/or other peripheral circuitry for operating a memory array may or may not be fully or partially within memory array region 18, with an example memory array region 18 as a minimum encompassing all of the memory cells of a given memory array/sub-memory array. Further, multiple sub-arrays might also be fabricated and operated independently, in tandem, or otherwise relative one another. As used herein, a "sub-array" or "sub-memory array" may be considered as an array.

Memory array circuitry isolation trenches 22 and peripheral circuitry isolation trenches 24, 26 have been formed within semiconductor material 12. By way of example, such may be formed by lithographic patterning of hard-masking material (not shown) over charge trapping material 16 followed by etch of materials 16, 14, and 12 to form isolation trenches 22, 24, and 26. The hard-masking material (not shown) may be removed or remain over the substrate during subsequent processing. The array isolation trenches may have the same or different maximum lateral width(s). The peripheral isolation trenches may have the same or different maximum lateral width(s) and/or depths, with different such widths and depths being shown for example trenches 24 and 26.

Figure 2:
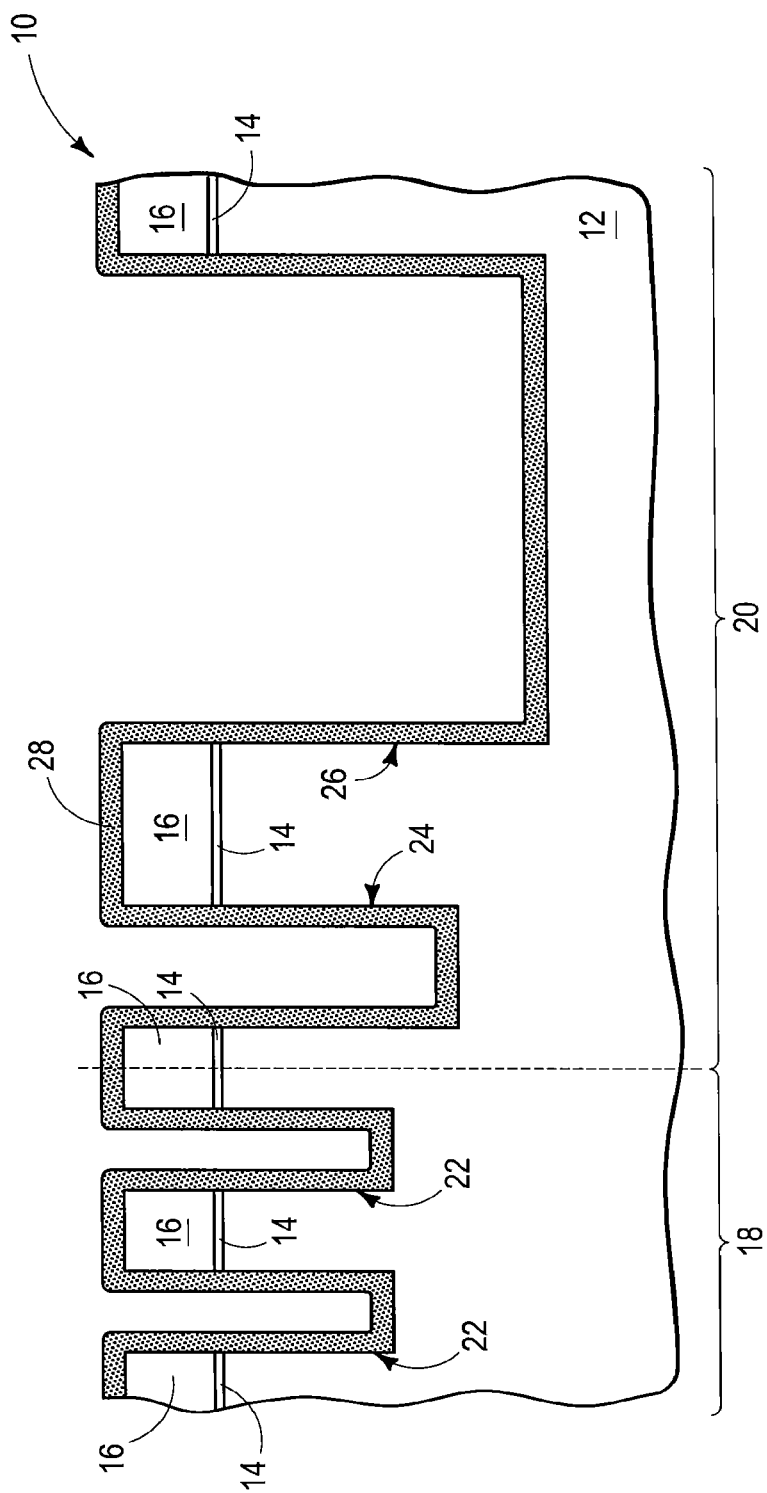
FIG. 2 is a view of the FIG. 1 substrate at a processing stage subsequent to that shown by FIG. 1.

Referring to FIG. 2, a silicon dioxide-comprising liner 28 has been chemical vapor deposited over sidewalls of memory array isolation trenches 22 and peripheral isolation trenches 24, 26. In the context of this document, a "liner" with respect to an opening is material within the opening that does not completely fill remaining volume of the opening, yet which is proximate to the sidewalls and/or a base of the opening. An example thickness range for liner 28 is from about 20 Angstroms to about 100 Angstroms, with 40 Angstroms being a specific example. The liner may be non-conformal. In one embodiment, TEOS and an oxygen-containing material are used as precursors for the depositing of liner 28. Example oxygen-containing materials include $O_2$, $O_3$, and $H_2O$, with $O_2$ and $O_3$ in combination (e.g., 12.5% $O_3$/87.5% $O_2$ by weight) being one ideal example. Regardless, an example temperature range for the chemical vapor depositing is a substrate temperature at from about 350° C. to about 600° C., with 540° C. being a specific example. Pressure within the chamber during the deposition may be subatmospheric, with and a range of from about 100 Torr to about 600 Torr being an example and about 500 Torr being a specific example. Unless otherwise noted herein, references to temperatures, pressures and other operating conditions are referring to such temperatures, pressures, and other operating conditions within a chamber in which the substrate is located during the relevant processing act. In one embodiment, the chemical vapor depositing may be void of plasma generation. An example processing tool for the deposition of liner 28 is the Producer SE™ available from Applied Materials of Santa Clara, Calif. A sidewall oxidation step of semiconductor material 12 within isolation trenches 22, 24, and/or 26 may additionally be conducted (not shown) before and/or after the chemical vapor depositing of liner 28. Liner 28 may be homogenous on non-homogenous, may be of uniform or variable density, and/or may or may not be of uniform thickness.

Figure 3:
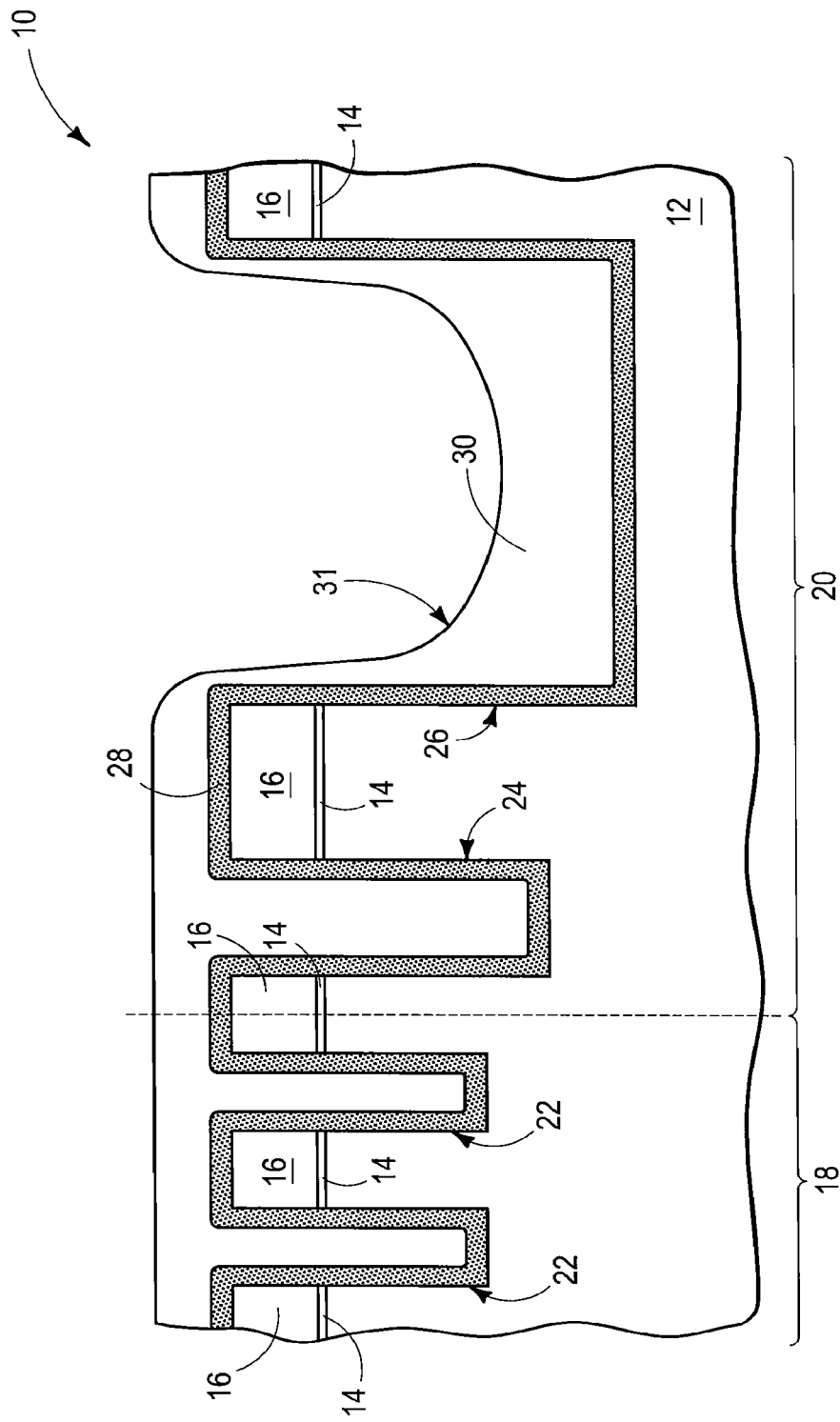
FIG. 3 is a view of the FIG. 2 substrate at a processing stage subsequent to that shown by FIG. 2.

Referring to FIG. 3, dielectric material 30 has been flowed over silicon dioxide-comprising liner 28 to fill remaining volume of array isolation trenches 22 and to form a dielectric liner 31 over silicon dioxide-comprising liner 28 in at least some of the peripheral isolation trenches. FIG. 3 depicts one embodiment wherein dielectric material 30 is flowed to form the dielectric liner in only some of the peripheral isolation trenches (e.g., liner 31 in peripheral isolation trench 26) and to fill other of the peripheral isolation trenches (e.g., peripheral isolation trench 24). In one ideal embodiment, the dielectric material that is flowed to produce the structure of FIG. 3 comprises a spin-on-dielectric (SOD). In one embodiment, the SOD comprises polysilazane, for example Spinfil™ 420 material available from AZ-Electronic Materials of Charlotte, N.C. Regardless, in one embodiment, dielectric material 30 is baked at from about 125° C. to 200° C. for at least about 2 minutes, and in one embodiment from about two minutes to about four minutes, in air at atmospheric pressure promptly after being initially applied. In one embodiment, dielectric liner 31 is formed to be thicker over bases of peripheral isolation trenches 26 than over elevationally outermost portions of sidewalls of peripheral isolation trenches 26. In one embodiment, the thickness of dielectric liner 31 over the elevationally outermost portions of such sidewalls increases moving in an elevationally inward direction. An example deposition thickness for dielectric material 30 is from about 750 Angstroms to about 2,000 Angstroms. As a specific example, a 1,400 Angstroms thick SOD as received elevationally above material 28 that is over material 16 may produce the FIG. 3 profile where lateral thickness of material 30 at adjacent the elevationally outermost surfaces of material 16 above isolation trenches 26 is about 200 Angstroms tapering to an uppermost surface of material 30 within isolation trenches 26 that is about 1,000 Angstroms elevationally inward relative to the uppermost surfaces of material 16.

Dielectric material 30 is furnace annealed at a temperature no greater than about 500° C., and in one embodiment at a temperature no greater than about 400° C. The furnace annealing may be conducted in an atmosphere that changes composition of the dielectric material, for example converting a polysilazane to silicon dioxide by the use of hydrogen and oxygen components in the annealing atmosphere. Regardless, an example furnace annealing temperature is from about 350° C. to about 500° C., with about 400° C. being a specific example. An example time for the furnace annealing is from about four hours to about ten hours, with about six hours being a specific example. In one example, $O_2$ may be flowed to the furnace initially at a chamber temperature of about 400° C., followed by addition of $H_2$ flow. Atmospheric or other pressure may be used.

The furnace annealing is followed by rapid thermal processing of the annealed dielectric to a temperature no less than about 800° C. An example maximum rapid thermal processing temperature is from about 875° C. to about 1025° C., with about 900° C. being a specific example. In the context of this document, "rapid thermal processing" requires a temperature ramp-up rate of at least 50° C. per second from at least about 650° C. to temperature above about 800° C. In one embodiment, the ambient for the rapid thermal processing is inert (e.g., $N_2$). An example time for the rapid thermal processing at temperature above 800° C. is from about one second to about forty seconds, with about twenty seconds being a specific example. Any suitable pressure may be used, with 780 Torr being a specific example. In one embodiment, a temperature ramp-up rate is at least 100° C. per second for at least from about 600° C. to at least about 800° C. In one embodiment, an example temperature ramp-down rate from about 900° C. to about 800° C. is at 50° C. per second, with an uncontrolled temperature ramp-down occurring below 800° C.

Figure 4:
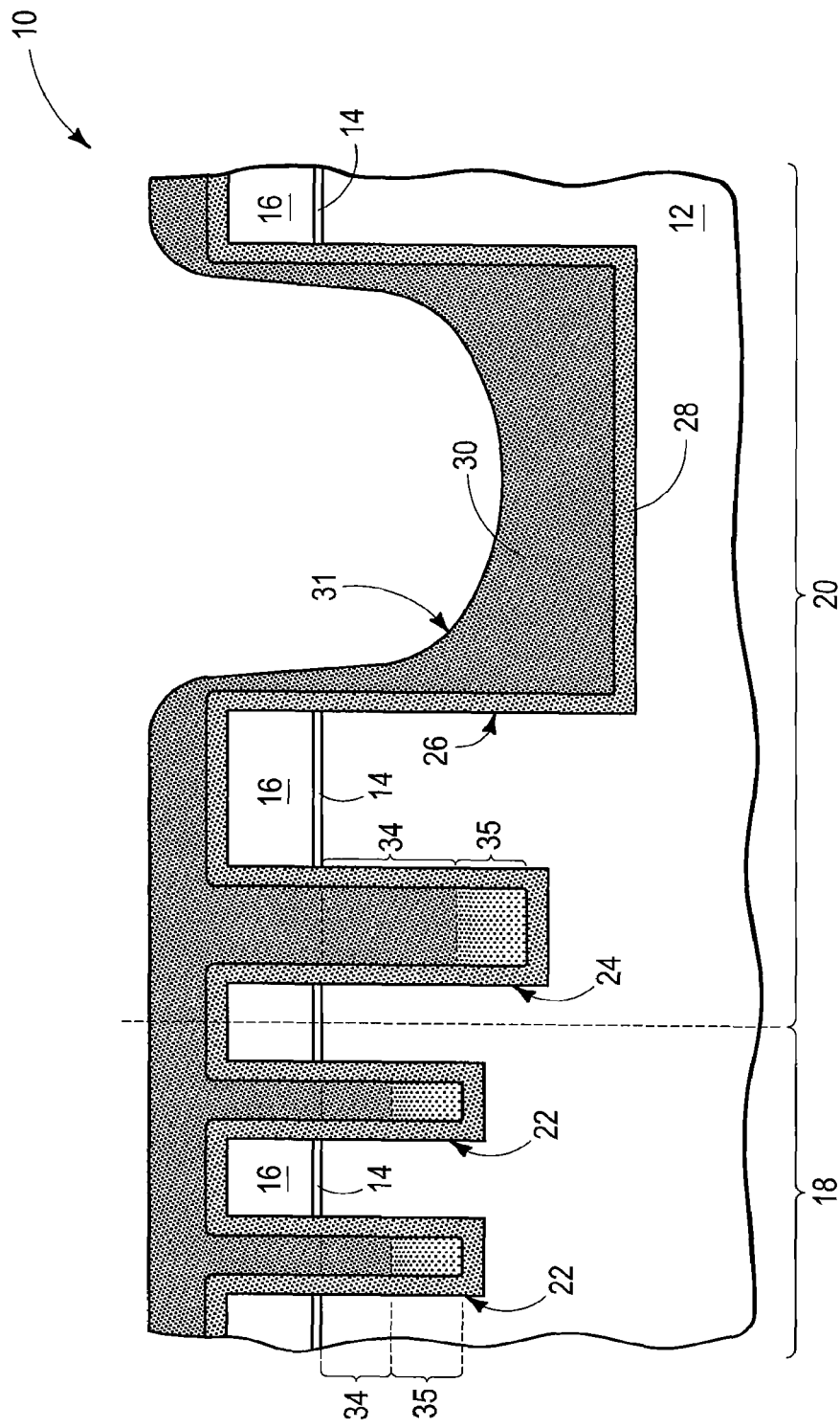
FIG. 4 is a view of the FIG. 3 substrate at a processing stage subsequent to that shown by FIG. 3.

FIG. 4 depicts an example embodiment of the substrate of FIG. 3 subsequent to the furnace annealing and rapid thermal processing. In one embodiment, the rapid thermal processed dielectric material 30 formed within array isolation trenches 22 is formed to have an elevationally outermost portion 34 of greater density than an elevationally inner portion 35. By way of example, such density difference may be characterized at least in part by greater porosity in inner portion 35 compared to any porosity in outermost portion 34. Regardless, in this document "density" is defined with respect to comparative etch rates in an approximate 200:1 liquid etching solution of water:HF by volume at room ambient temperature and room ambient pressure, with higher density meaning lower etch rate under such conditions. Accordingly, one silicon dioxide-comprising material that etches slower than another silicon dioxide-comprising material under such conditions means that the one has higher density than the other. Density is exemplified in the figures by varying density of stippling, with less stippling qualitatively indicating lower density.

Outermost portion 34 and inner portion 35 may be of the same elevational thickness or of different elevational thicknesses. Outermost portion 34 is characterized by some outermost thickness of annealed and rapid thermal processed material 30 within an isolation trench that has the highest and uniform density throughout the selected outermost part of such material 30 within the isolation trench. That part is not necessarily all of the elevationally outermost part of material 30 within the isolation trench that is at a highest uniform density. Inner portion 35 is characterized as some portion of annealed and rapid thermal processed material 30 that is elevationally inward of outermost portion 34 and that might not be of uniform density, and regardless has lower average density than outermost portion 34. Inner portion 35 is not necessarily the innermost portion of such material 30 within an isolation trench, nor necessarily directly against outermost portion 34. However in one embodiment, inner portion 35 is the innermost portion of such material 30 within an isolation trench, and in one embodiment is directly against outermost portion 34. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another.

Rapid thermal processed dielectric material 30 within peripheral isolation trenches 26 comprising liner 31 may be formed to be of uniform density that is the same as the density of elevationally outermost portion 34 of rapid thermal processed dielectric material 30 within array isolation trenches 22. In the context of this document, densities are the "same" or "uniform" when their comparative etch rates in Angstroms per second in an approximate 200:1 liquid etching solution of water:HF by volume at room ambient temperature and room ambient pressure are within 5% of one another. Rapid thermal processed dielectric material 30 within peripheral isolation trenches that have been completely filled by material 30 (e.g., peripheral isolation trench 24) may be of uniform density (not shown) the same as elevationally outermost portion 34, or may be of variable density (as shown). In one embodiment, furnace annealed and rapid thermal processed dielectric 30 within peripheral isolation trenches 24 may be characterized by outermost and inner portions 34, 35, respectively, as shown.

In one embodiment, the rapid thermal processed dielectric material 30 within array isolation trenches 22 is formed to have an elevationally outermost portion 34 of greater molar concentration of silicon dioxide than an elevationally inner portion 35. The rapid thermal processed dielectric material 30 within the peripheral isolation trenches comprising liner 31 may be formed to be of uniform molar concentration of silicon dioxide that is the same as the molar concentration of silicon dioxide of the elevationally outermost portion 34 of rapid thermal process dielectric material 30 within array isolation trenches 22. Accordingly, density and/or molar concentration of silicon dioxide may vary, and within the same or different elevational outermost portions and elevationally inner portions. In the context of this document, silicon dioxide molar concentrations in moles per cubic nanometer are the "same" or "uniform" when within 5% of one another. Silicon dioxide molar concentration is exemplified in the figures by varying density of stippling, with less stippling qualitatively indicating lower silicon dioxide concentration. Any material 30 density variation and concentration variation when both are present may not necessarily elevationally coincide, although such is so represented for convenience in the figures.

Figure 5:
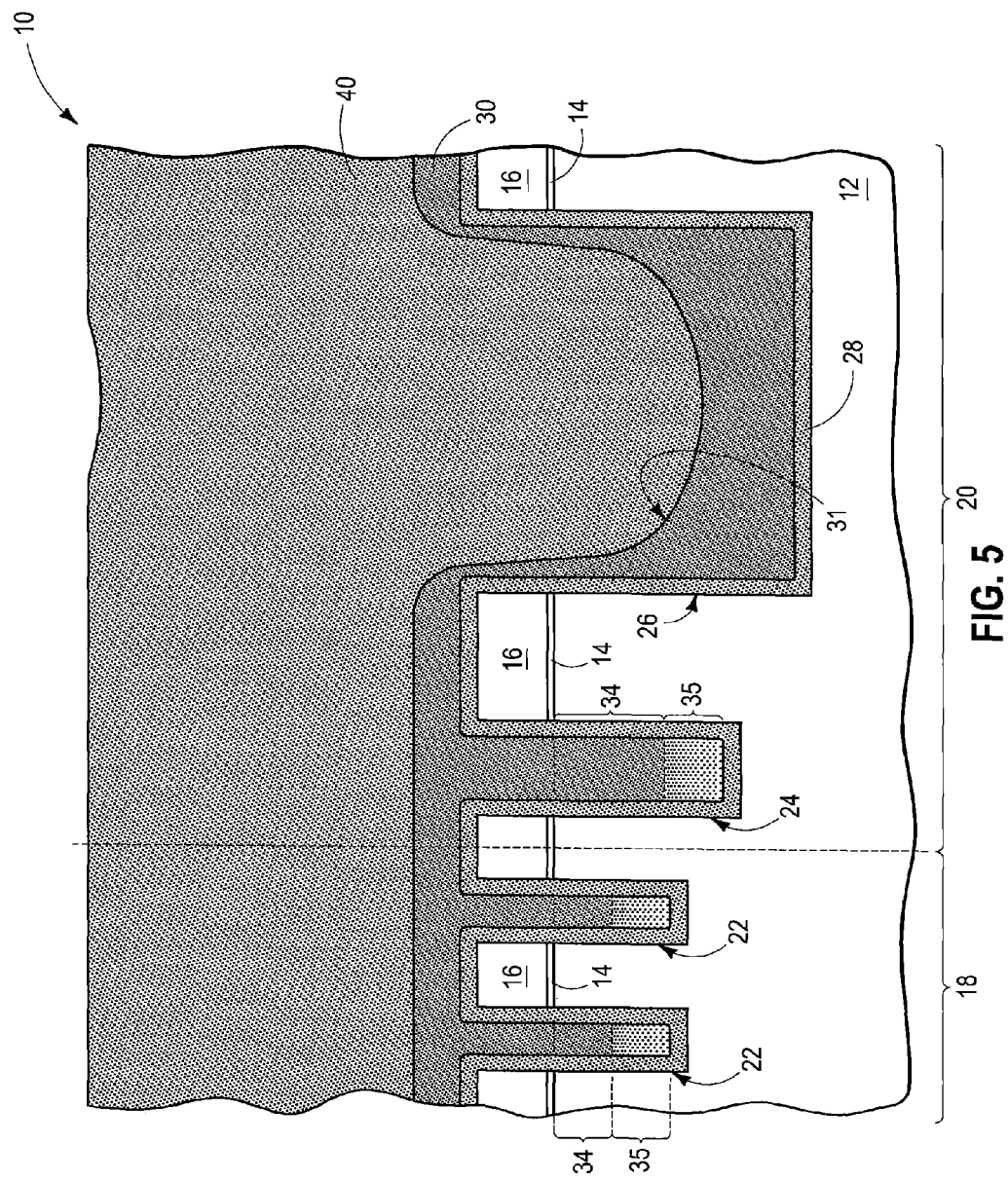
FIG. 5 is a view of the FIG. 4 substrate at a processing stage subsequent to that shown by FIG. 4.

Referring to FIG. 5, a silicon dioxide-comprising material 40 has been chemical vapor deposited over rapid thermal processed dielectric material 30 to fill remaining volume of peripheral isolation trenches 26 within which liner 31 is received. Such material may be homogenous or non-homogenous, for example comprising multiple different compositions, and may be of uniform or variable density. Silicon dioxide-comprising material 40 may be of the same or different composition and/or density as silicon dioxide-comprising liner 28. Regardless, in one embodiment, the precursors used for chemical vapor depositing liner 28 and material 40 are of the same composition. Regardless, in one embodiment, deposition of silicon-dioxide comprising material 40 is conducted by depositing an initial portion at a first deposition rate and a final portion at a second deposition rate, where the second deposition rate is greater than the first deposition rate. In one embodiment, the final portion is deposited to be thicker than is the initial portion.

An example thickness range for chemical vapor deposition of silicon dioxide-comprising material 40 above material 30 over material 16 is from about 3,000 Angstroms to about 5,000 Angstroms, with about 4,000 Angstroms being a specific example. An example deposition temperature range is from about 350° C. to about 600° C., with 540° C. being a specific example. An example deposition for an initial portion is for about 200 seconds to deposit about 500 Angstroms of material 40 at 500 Torr using TEOS flow of about 2,000 milligrams per minute and $O_2/O_3$ flow (87.5% $O_2$/12.5% $O_3$ by volume) at about 27,000 sccm. For a final portion deposition, an example is to increase TEOS injection to about 7,000 milligrams per minute which increases the deposition rate, and which may be continued for about another 160 seconds to achieved desired thickness.

In one embodiment, chemical vapor deposited silicon dioxide-comprising material 40 within peripheral isolation trenches 26 is of uniform density that is less than a uniform density of dielectric liner 31 within peripheral isolation trenches 26 (e.g., in one embodiment at least 5% less). In one embodiment, chemical vapor deposited silicon dioxide-comprising material 40 within peripheral isolation trenches 26 is of uniform molar concentration of silicon dioxide that is less than a uniform molar concentration of silicon dioxide of dielectric liner 31 within peripheral isolation trenches 26 (e.g., in one embodiment at least 5% less).

Chemical vapor deposited silicon-dioxide comprising liner 28 and/or chemical vapor deposited silicon dioxide-comprising material 40 may be deposited by HARP and/or eHARP/EHARP processing as described in one or more of U.S. Patent Application Publications 2011/0151676; 2010/0230757; 2011/0049669; and U.S. Pat. No. 7,838,390.

Figure 6:
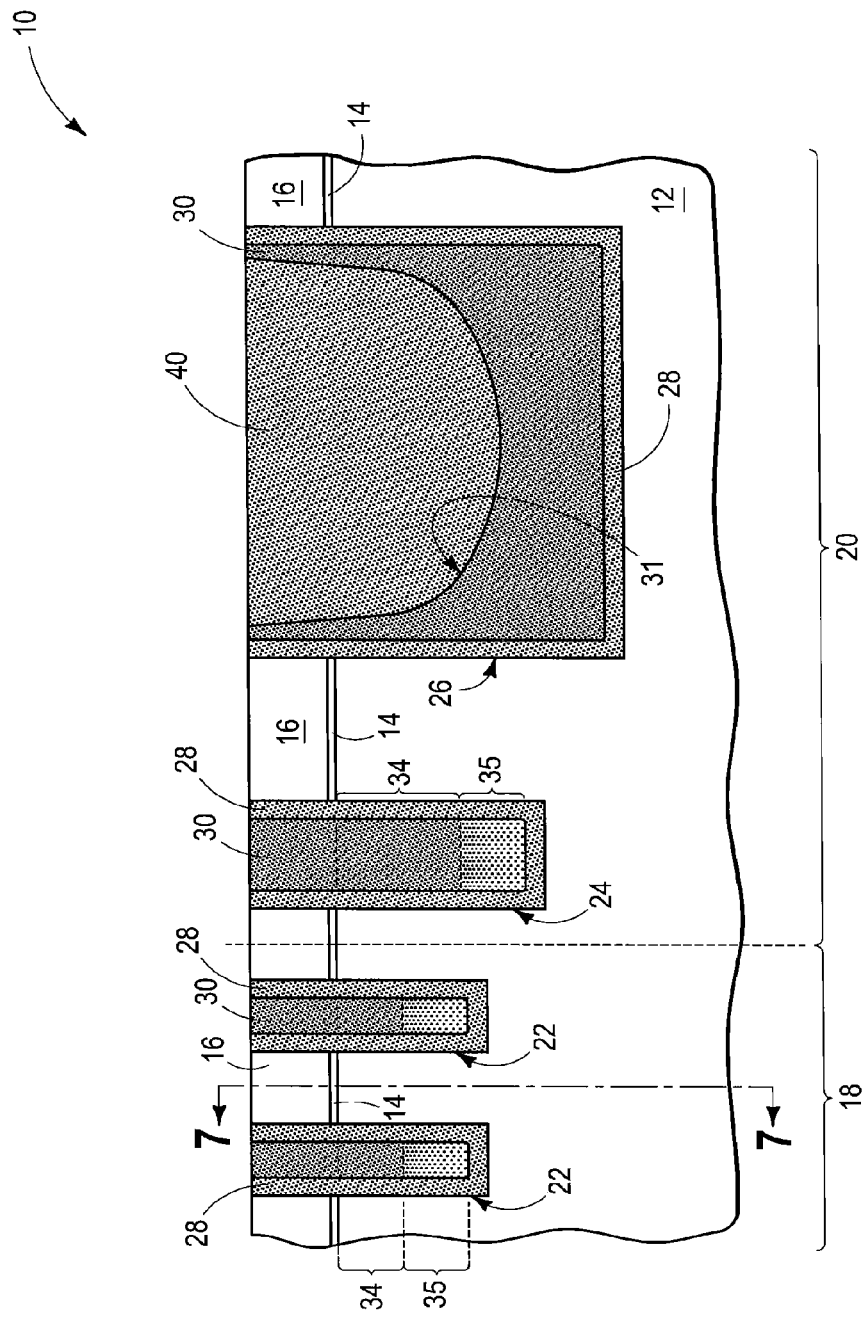
FIG. 6 is a view of the FIG. 5 substrate at a processing stage subsequent to that shown by FIG. 5.

Referring to FIG. 6, substrate 10 has been planarized (e.g., by chemical mechanical polishing) at least to an outermost surface of charge trapping material 16.

Figure 7:
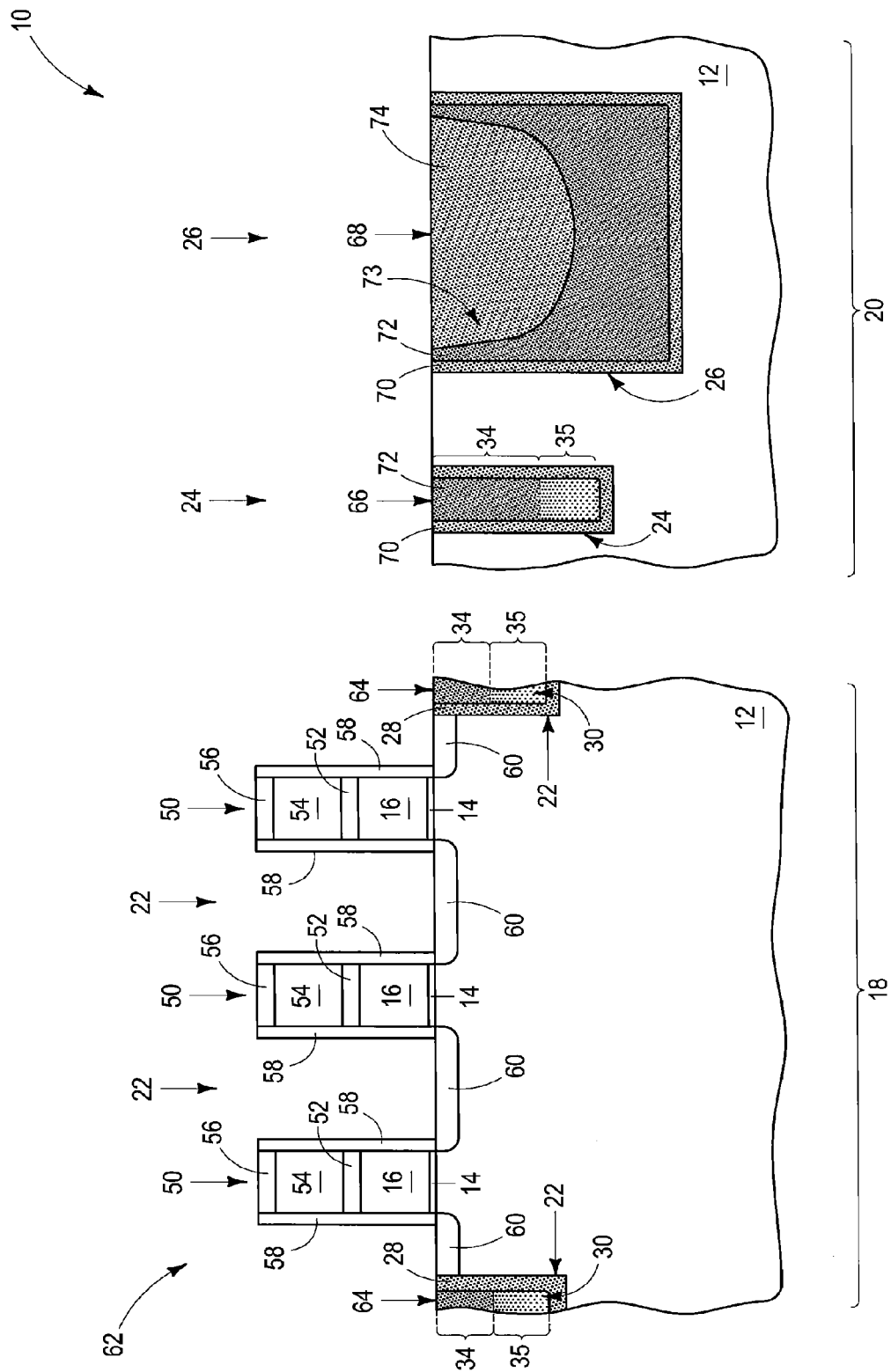
FIG. 7 is a reduced-scale view of the FIG. 6 substrate at a processing stage subsequent to that shown by FIG. 6.

FIG. 7 is a reduced scale view taken along line 7-7 of FIG. 6 and includes structures formed during additional processing acts to that depicted through FIG. 6. By way of example only, liner 28 and materials 30 and 40 have been etched back at least within array isolation trenches 22. Programmable transistor gate structures 50 have been formed which comprise tunnel dielectric 14 and charge trapping material 16. Inter-gate dielectric material 52 has been formed over charge trapping material 52, and conductive control gate material 54 has formed there-over. A dielectric cap 56 and dielectric sidewall spacers 58 may be formed as shown as part of gate constructions 50. Source/drain regions 60 have been formed within semiconductor material 12. Variations to the structure of FIG. 7 and other figures are possible without necessary departing from the scope of the invention. Regardless, in one embodiment the memory array is formed to comprise flash memory.

Processing as described broadly above with respect to furnace annealing the dielectric material at a temperature no greater than about 500° C. followed by rapid thermal processing the annealed dielectric material to a temperature no less than about 800° C. has been shown alleviate line bending and reduce substrate dislocation damage. Such did not occur if conducting and extending the furnace annealing without rapid thermal processing.

Novel integrated circuit devices may result from method embodiments of the invention as are described below. Additionally, embodiments of the invention encompass integrated circuit devices independent of method of manufacture. As but one example embodiment, FIG. 7 depicts an integrated circuit device 62 comprising memory array circuitry trench isolation 64 within a memory array region 18 and peripheral circuitry trench isolation 68 within a region 20 peripheral to memory array region 18. Additional trench isolation, for example peripheral circuitry trench isolation 66, may also be formed within peripheral region 20. Memory array trench isolation 64 comprises a first silicon dioxide-comprising liner 28 and a second silicon dioxide-comprising material 30 laterally inward of liner 28. Peripheral trench isolation 68 comprises a third silicon dioxide-comprising liner 70 (e.g., liner 28 in FIG. 6) and a fourth silicon dioxide-comprising material 72 (e.g., material 30 in FIG. 6) laterally inward of liner 70. In one embodiment, fourth silicon dioxide-comprising material 72 forms a liner 73 (e.g., liner 31 in FIG. 6) over third silicon dioxide-comprising liner 70. In such event, a fifth dielectric material 74 (e.g., material 40 in FIG. 6) may be received laterally inward of fourth silicon dioxide-comprising liner 73 as part of peripheral trench isolation 68, and in one embodiment may comprise silicon dioxide.

In one embodiment, second silicon dioxide-comprising material 30 of memory array trench isolation 64 has an elevationally outermost portion 34 of greater density than an elevationally inner portion 35. Density attributes for portions 34 and 35 may be as described above in the method embodiments. Fourth silicon dioxide-comprising material 72 of peripheral trench isolation 68 is of uniform density that is the same as the density of elevationally outermost portion 34 of second silicon dioxide-comprising material 30 of memory array trench isolation 64. In one embodiment, second silicon dioxide-comprising material 30 has an elevational density gradient from an elevationally innermost portion to elevationally outermost portion 34. The density gradient may be linear (i.e., density change being uniform per unit elevational thickness change from the base of the elevationally innermost portion to the elevationally outermost portion) or the density gradient may be non-linear.

First silicon dioxide-comprising liner 28 and third silicon dioxide-comprising liner 70 may be of the same composition or of different compositions, and regardless may be of the same density or different densities. In one embodiment, the memory array trench isolation is devoid of any silicon nitride-comprising liner, and in one embodiment the memory array circuitry comprises flash memory. Any other attributes as described an shown above in the constructions regarding the method disclosure may be in the device aspects of the invention and independent of method used to form the device.

In one embodiment, second silicon dioxide-comprising material 30 of memory array trench isolation 64 has an elevationally outermost portion of greater molar concentration of silicon dioxide than an elevationally inner portion. Portions 34 and 35, respectively, are example such portions, and regardless if of the same dimension and regardless in one embodiment of any density variation between an elevationally outermost portion and an elevationally inner portion. Fourth silicon dioxide-comprising material 72 of peripheral trench isolation 68 may be of uniform molar concentration of silicon dioxide that is the same as the molar concentration of silicon dioxide of the elevationally outermost portion of second silicon dioxide-comprising material 30 of memory array trench isolation 64, and independent of uniform or variable density, and independent of density of second silicon dioxide-comprising material 30.

In one embodiment, second silicon dioxide-comprising material 30 has an elevational silicon dioxide molar concentration gradient from an elevationally innermost portion to the elevationally outermost portion. The concentration gradient may be linear (i.e., concentration change being uniform per unit elevational thickness change from the base of the elevationally innermost portion to the elevationally outermost portion) or the concentration gradient may be non-linear.

Any other attribute from the method embodiments may be in the structure of the device embodiments.

Figure 8:
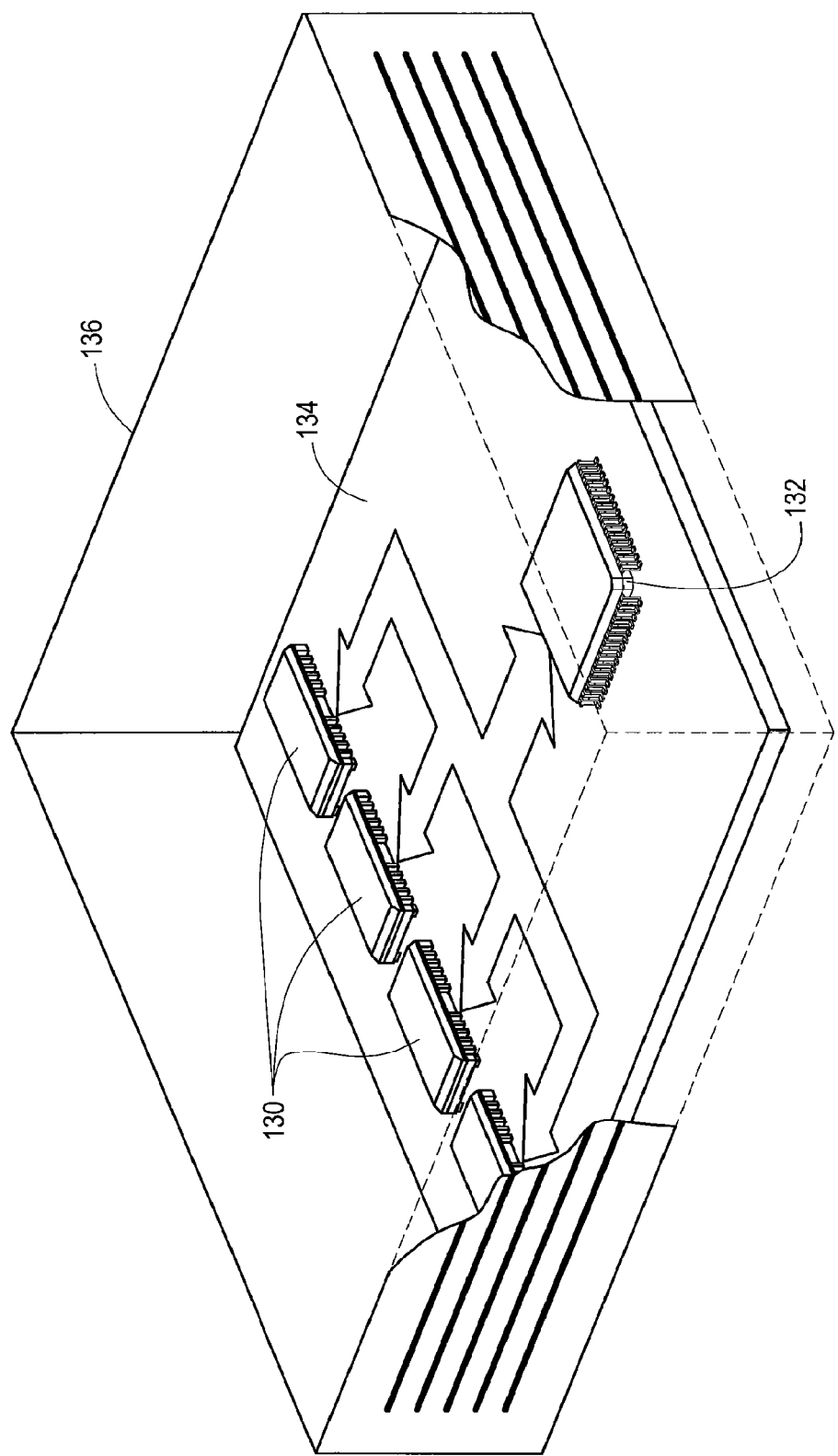
FIG. 8 is an isometric depiction of various components which may be manufactured using devices of the invention.

Integrated circuit devices in accordance with embodiments of the invention may comprise a memory device 130 as depicted in FIG. 8. Memory device 130 may be attached along with other devices such as a microprocessor 132 to a printed circuit board 134, for example to a computer motherboard or as a part of a memory module used in a personal computer, a minicomputer, or a mainframe 136. The microprocessor and/or memory devices may comprise an embodiment of the present invention. FIG. 8 may also represent use of device 130 in other electronic systems comprising a housing 136, for example systems comprising a microprocessor 132, related to telecommunications, the automobile industry, semiconductor test and manufacturing equipment, consumer electronics, or virtually any piece of consumer or industrial electronic equipment.

Figure 9:
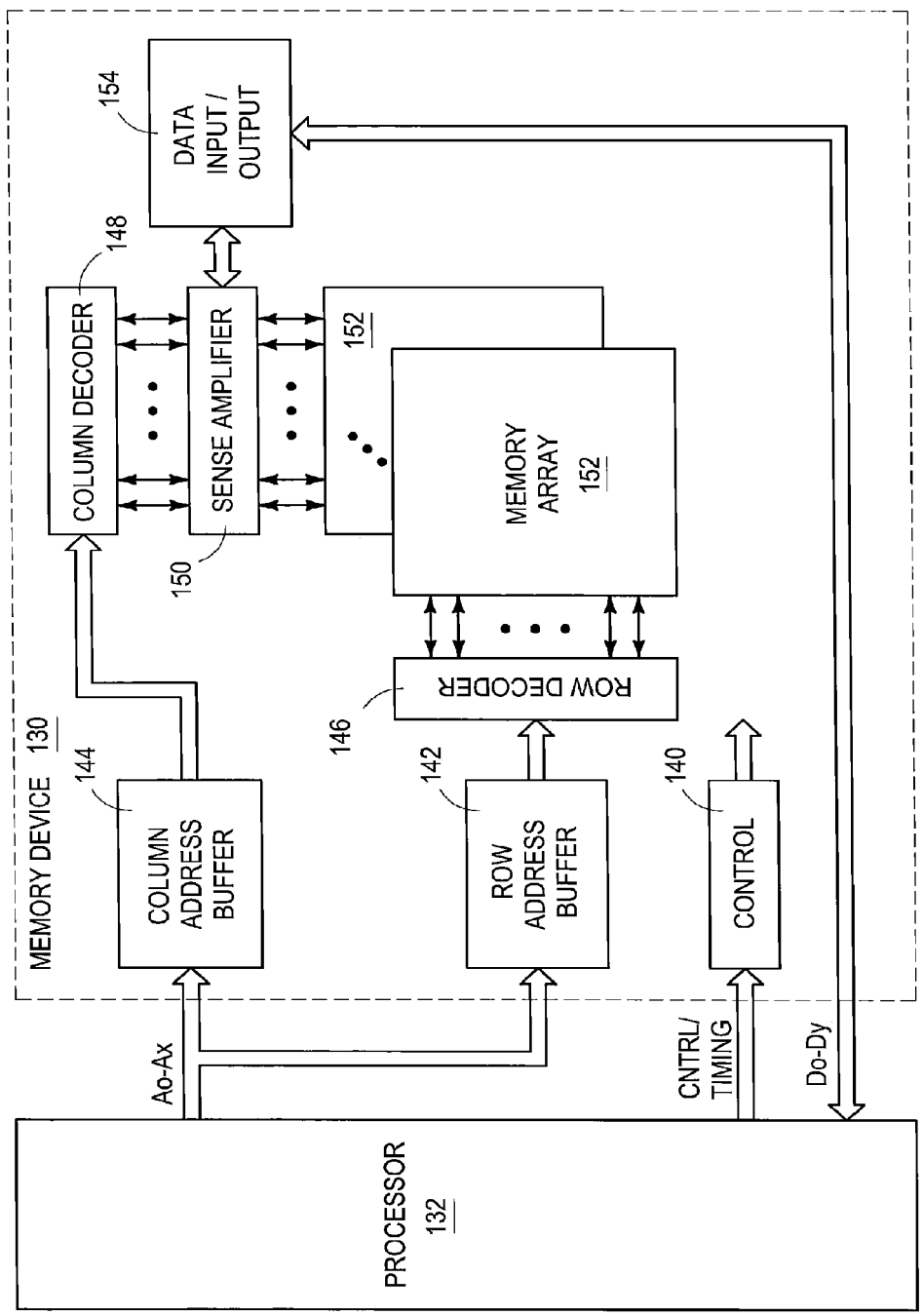
FIG. 9 is a block diagram of an example use embodiments of the invention to form part of a memory device having a memory array.

The methods and devices described herein can be used to manufacture a number of different structures comprising trench isolation. FIG. 9, for example, is a simplified block diagram of a memory device having trench isolation which may be formed using an embodiment of the present invention. The general operation of such a device is known to one skilled in the art. FIG. 9 depicts a processor 132 coupled to a memory device 130, and further depicts the following example sections of a memory integrated circuit: control circuitry 140; row address buffer 142; column address buffer 144; row decoder 146; column decoder 148; sense amplifier 150; memory array 152; and data input/output 154.

CONCLUSION

In some embodiments, a method of forming memory array and peripheral circuitry isolation comprises chemical vapor depositing a silicon dioxide-comprising liner over sidewalls of memory array circuitry isolation trenches and peripheral circuitry isolation trenches formed in semiconductor material. Dielectric material is flowed over the silicon dioxide-comprising liner to fill remaining volume of the array isolation trenches and to form a dielectric liner over the silicon dioxide-comprising liner in at least some of the peripheral isolation trenches. The dielectric material is furnace annealed at a temperature no greater than about 500° C. The annealed dielectric material is rapid thermal processed to a temperature no less than about 800° C. A silicon dioxide-comprising material is chemical vapor deposited over the rapid thermal processed dielectric material to fill remaining volume of said at least some peripheral isolation trenches.

In some embodiments, a method of forming memory array and peripheral circuitry isolation comprises first chemical vapor depositing a silicon dioxide-comprising liner over sidewalls of memory array circuitry isolation trenches and peripheral circuitry isolation trenches formed in semiconductor material. The first chemical vapor depositing occurs at from about 350° C. to 600° C., at subatmospheric pressure, and using at least tetraethylorthosilicate and $O_3$ as precursors. Polysilazane-comprising SOD is flowed over the silicon dioxide-comprising liner to fill remaining volume of the array isolation trenches and to form a dielectric liner over the silicon dioxide-comprising liner in at least some of the peripheral isolation trenches. The polysilazane-comprising SOD is baked at from about 125° C. to 200° C. for from about 2 minutes to 4 minutes. The baked polysilazane-comprising SOD is furnace annealed at a temperature no greater than about 400° C. in the presence of hydrogen and oxygen to form silicon dioxide-comprising isolation material. The silicon dioxide-comprising isolation material is rapid thermal processed to a temperature no less than about 800° C. A silicon dioxide-comprising material is second chemical vapor deposited over the silicon dioxide-comprising isolation material to fill remaining volume of said at least some peripheral isolation trenches.

In some embodiments, an integrated circuit device comprises memory array circuitry trench isolation within a memory array region and peripheral circuitry trench isolation within a region peripheral to the memory array region. The memory array trench isolation comprises a first silicon dioxide-comprising liner and a second silicon dioxide-comprising material laterally inward of the first silicon dioxide-comprising liner. The peripheral trench isolation comprises a third silicon dioxide-comprising liner and a fourth silicon dioxide-comprising material laterally inward of the third silicon dioxide-comprising liner. The second silicon dioxide-comprising material of the memory array trench isolation has an elevationally outermost portion of greater density than an elevationally inner portion. The fourth silicon dioxide-comprising material of the peripheral trench isolation is of uniform density that is the same as the density of the elevationally outermost portion of the second silicon dioxide-comprising material of the memory array trench isolation.

In some embodiments, an integrated circuit device comprises memory array circuitry trench isolation within a memory array region and peripheral circuitry trench isolation within a region peripheral to the memory array region. The memory array trench isolation comprises a first silicon dioxide-comprising liner and a second silicon dioxide-comprising material laterally inward of the first silicon dioxide-comprising liner. The peripheral trench isolation comprises a third silicon dioxide-comprising liner and a fourth silicon dioxide-comprising material laterally inward of the third silicon dioxide-comprising liner. The second silicon dioxide-comprising material of the memory array trench isolation has an elevationally outermost portion of greater molar concentration of silicon dioxide than an elevationally inner portion. The fourth silicon dioxide-comprising material of the peripheral trench isolation is of uniform molar concentration of silicon dioxide that is the same as the molar concentration of silicon dioxide of the elevationally outermost portion of the second silicon dioxide-comprising material of the memory array trench isolation.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuit device, comprising:
   memory array circuitry trench isolation within a memory array region and peripheral circuitry trench isolation within a region peripheral to the memory array region, the memory array trench isolation comprising a first silicon dioxide-comprising liner and a second silicon dioxide-comprising material laterally inward of the first silicon dioxide-comprising liner, the peripheral trench isolation comprising a third silicon dioxide-comprising liner and a fourth silicon dioxide-comprising material laterally inward of the third silicon dioxide-comprising liner; and
   the second silicon dioxide-comprising material of the memory array trench isolation having an elevationally outermost portion of greater density than an elevationally inner portion, the fourth silicon dioxide-comprising material of the peripheral trench isolation being of uniform density that is the same as the density of the elevationally outermost portion of the second silicon dioxide-comprising material of the memory array trench isolation.

2. The device of claim 1 wherein the memory array trench isolation is devoid of any silicon nitride-comprising liner.

3. The device of claim 1 wherein the first and third silicon dioxide-comprising liners are of the same composition.

4. The device of claim 1 wherein the first and third silicon dioxide-comprising liners are each of uniform density that is the same as one another.

5. The device of claim 1 wherein the first and third silicon dioxide-comprising liners are of the same composition and are each of uniform density that is the same as one another.

6. The device of claim 1 wherein the density of the elevationally inner portion is not uniform.

7. The device of claim 6 wherein the second silicon dioxide-comprising material has an elevational density gradient from an elevationally innermost portion to the elevationally outermost portion.

8. The device of claim 7 wherein the density gradient is linear.

9. The device of claim 7 wherein the density gradient is non-linear.

10. The device of claim 1 wherein the fourth silicon dioxide-comprising material forms a liner over the third silicon dioxide-comprising liner, and further comprising a fifth dielectric material laterally inward of the fourth silicon dioxide-comprising liner as part of the peripheral trench isolation.

11. The device of claim 10 wherein the fifth dielectric material comprises silicon dioxide.

12. The device of claim 11 wherein the third silicon dioxide-comprising liner and the fifth dielectric material are of the same composition.

13. The device of claim 11 wherein the third silicon dioxide-comprising liner and the fifth dielectric material are each of uniform density that is the same as one another.

14. The device of claim 11 wherein the third silicon dioxide-comprising liner and the fifth dielectric material are of the same composition and are each of uniform density that is the same as one another.

15. The device of claim 14 wherein the first and third silicon dioxide-comprising liners and the fifth dielectric material are of the same composition and the same density.

16. The device of claim 10 wherein the fifth dielectric material has a uniform density that is less than the uniform density of the fourth silicon dioxide-comprising liner.

17. The device of claim 1 wherein the third silicon dioxide-comprising liner is thicker at elevationally innermost portions of the peripheral circuitry isolation than at elevationally and laterally outermost portions of the peripheral circuitry isolation.

18. The device of claim 17 wherein the thickness of the third silicon dioxide-comprising liner at said elevationally and laterally outermost portions increases in an elevationally inward direction.

19. The device of claim 1 wherein the elevationally inner portion is the elevationally innermost portion of the second silicon dioxide comprising material, and is directly against the elevationally outermost portion.

20. The device of claim 1 wherein the memory array circuitry comprises flash memory.

21. An integrated circuit device, comprising:
memory array circuitry trench isolation within a memory array region and peripheral circuitry trench isolation within a region peripheral to the memory array region, the memory array trench isolation comprising a first silicon dioxide-comprising liner and a second silicon dioxide-comprising material laterally inward of the first silicon dioxide-comprising liner, the peripheral trench isolation comprising a third silicon dioxide-comprising liner and a fourth silicon dioxide-comprising material laterally inward of the third silicon dioxide-comprising liner; and the second silicon dioxide-comprising material of the memory array trench isolation having an elevationally outermost portion of greater molar concentration of silicon dioxide than an elevationally inner portion, the fourth silicon dioxide-comprising material of the peripheral trench isolation being of uniform molar concentration of silicon dioxide that is the same as the molar concentration of silicon dioxide of the elevationally outermost portion of the second silicon dioxide-comprising material of the memory array trench isolation.

22. The device of claim 21 wherein the second silicon dioxide-comprising material has an elevational silicon dioxide molar concentration gradient from an elevationally innermost portion to the elevationally outermost portion.

23. The device of claim 21 wherein the fourth silicon dioxide-comprising material forms a liner over the third silicon dioxide-comprising liner, and further comprising a fifth dielectric material laterally inward of the fourth silicon dioxide-comprising liner as part of the peripheral trench isolation.

24. The device of claim 23 wherein the fifth dielectric material has a uniform molar concentration of silicon dioxide that is less than the uniform molar concentration of silicon dioxide of the fourth silicon dioxide-comprising liner.

25. The device of claim 21 wherein the memory array trench isolation is devoid of any silicon nitride-comprising liner.

26. The device of claim 21 wherein the third silicon dioxide-comprising liner is thicker at elevationally innermost portions of the peripheral circuitry isolation than at elevationally and laterally outermost portions of the peripheral circuitry isolation.

27. The device of claim 26 wherein the thickness of the third silicon dioxide-comprising liner at said elevationally and laterally outermost portions increases in an elevationally inward direction.

* * * * *